(12) United States Patent
Uenishi

(10) Patent No.: US 6,188,263 B1
(45) Date of Patent: Feb. 13, 2001

(54) ELECTROSTATIC PROTECTION CIRCUIT

(75) Inventor: Yasutaka Uenishi, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/122,698

(22) Filed: Jul. 27, 1998

(30) Foreign Application Priority Data

Jul. 28, 1997 (JP) .................................................. 9-201962

(51) Int. Cl.$^7$ ........................................................ H03K 5/08
(52) U.S. Cl. .................................................. 327/313; 361/56
(58) Field of Search ...................................... 327/309, 313, 327/318, 321, 327, 328, 331; 361/56, 91, 111

(56) References Cited

U.S. PATENT DOCUMENTS

| 5,617,283 | * | 4/1997 | Krakauer et al. | .................. | 361/56 |
| 5,644,459 | | 7/1997 | Lien | .................. | 361/56 |
| 5,671,111 | * | 9/1997 | Chen | .................. | 361/56 |
| 5,729,419 | * | 3/1998 | Lien | .................. | 361/111 |
| 5,910,874 | * | 6/1999 | Iniewski et al. | .................. | 361/56 |

FOREIGN PATENT DOCUMENTS

| 0 497 471 | 8/1992 | (EP) . |
| 0 687 068 | 12/1995 | (EP) . |
| 62-105462 | 5/1987 | (JP) . |

* cited by examiner

Primary Examiner—Timothy P. Callahan
Assistant Examiner—Hai L. Nguyen
(74) Attorney, Agent, or Firm—Sughrue, Mion, Zinn, Macpeak & Seas, PLLC

(57) ABSTRACT

An electrostatic protection circuit protects an internal circuit from electric charge which is applied via an electrode pad. The above electrostatic protection circuit mainly includes a protection transistor portion, a second transistor and a third transistor. In this case, the protection transistor portion includes a first transistor having a first gate electrode in order to protect the internal circuit by discharging the electric charge. The second transistor controls so as to keep the first gate electrode into a floating state before the power source is introduced. The third transistor gives a predetermined potential into the first gate electrode.

3 Claims, 8 Drawing Sheets

ELECTROSTATIC PROTECTION CIRCUIT

BACKGROUND OF THE INVENTION

This invention relates to an electrostatic protection circuit for use in a semiconductor integrated circuit, such as, an integrated circuit (IC) and a large-scale integrated circuit (LSI).

An electrostatic protection circuit of the type described has been generally used in order to prevent destruction caused by an electrostatic discharge (thereinafter, abbreviated as an ESD) in a semiconductor integrated circuit.

For instance, the conventional electrostatic protection circuit is mainly composed of a P-channel MOS transistor and an N-channel MOS transistor. In this event, these MOS transistors are connected in series to each other. In this condition, the P-channel MOS transistor is connected to a power supply terminal while the N-channel MOS transistor is connected to a ground terminal.

With such a structure, another MOS transistor is often connected to a gate of the above N-channel MOS transistor so as to control a floating state and to reduce a breakdown voltage thereof.

In consequence, the N-channel MOS transistor transfers into a snapback state in order to reduce the EDS pulse which is applied to the gate electrode of the N-channel MOS transistor.

In order to prevent the EDS pulse, the protection transistor must have a large area. Usually, such a protection transistor is structured by a plurality of transistors which are connected in parallel in the electrostatic protection circuit.

However, the breakdown voltages of the protection transistors are fluctuated to one another in the above structure. Consequently, electric charge is concentrated to a specific one of the transistors that has a lowest break down voltage. As a result, the ESD pulse can not be effectively reduced.

SUMMARY OF THE INVENTION

It is therefore an object of this invention to provide to an electrostatic protection circuit which is capable of preventing fluctuation of breakdown voltages between protection transistors.

It is another object of this invention to provide electrostatic protection circuit which is capable of putting a gate electrode of a protection transistor into a stable floating state when an ESD pulse is applied.

It is still another object of this invention to provide electrostatic protection circuit which is capable of easily transferring into a snap back.

It is still further object of this invention to provide electrostatic protection circuit which is capable of improving resistance to destruction against a protection transistor.

According to this invention, an electrostatic protection circuit protects an internal circuit from electric charge which is applied via an electrode pad. In this event, the electrostatic protection circuit is coupled to a power source.

The above electrostatic protection circuit mainly includes a protection transistor portion, a second transistor and a third transistor.

In this case, the protection transistor portion includes a first transistor having a first gate electrode in order to protect the internal circuit by discharging the electric charge.

Further, the second transistor controls so as to keep the first gate electrode into a floating state before the power source is introduced. Moreover, the third transistor gives a predetermined potential into the first gate electrode.

Consequently, the first gate electrode of the first transistor is raised up to easily put into the floating state. As a result, the breakdown voltage becomes low to easily put into the snapback state. Thereby, the ESD pulse is effectively reduced.

Namely, the third transistor is inserted between the gate electrode of the first transistor and the electrode pad. Thereby, the potential of the first gate electrode of the first transistor is stably increased by the drain and source capacitance of the inserted third transistor when the ESD pulse is applied. Consequently, the first gate electrode is raised up to suppress the fluctuation of the breakdown voltage and to reduce the break down voltage. As a result, the first transistor easily transfers into the snapback state.

DESCRIPTION OF THE PREFERRED EMBODIMENT

Referring to FIGS. 1 through 6, conventional electrostatic protection circuits will first be described for a better understanding of this invention. The electrostatic protection circuit is equivalent to the conventional electrostatic protection circuit described in the preamble of the instant specification.

First Conventional Example

Description will first be made about an electrostatic protection circuit according to a first conventional example with reference to FIG. 1.

The electrostatic protection circuit is mainly composed of a P-channel MOS transistor PHT1 and an N-channel MOS transistor NHT1. In this event, these transistors PHT1 and NHT1 are connected in series between a power supply terminal VDD and a ground terminal GND.

More specifically, a source electrode and a gate electrode are commonly connected to the power supply VDD in the P-channel MOS transistor PHT1 while a source electrode and a gate electrode are commonly connected to the ground terminal GND in the N-channel MOS transistor.

In this case, an electrode pad 1 and a wiring line L1 are coupled to a connection point between the P-channel MOS transistor PHT1 and the N-channel MOS transistor NFT1. In this condition, the electrostatic protection circuit is connected to an internal circuit (not shown) via the wiring line L1.

Figure 1:
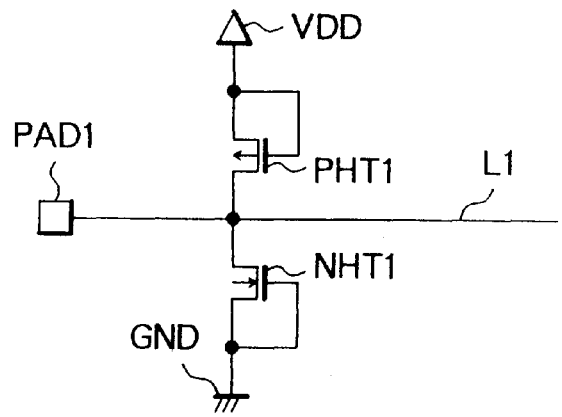
FIG. 1 is a block diagram showing an electrostatic protection circuit according to a first conventional example.
Figure 4:
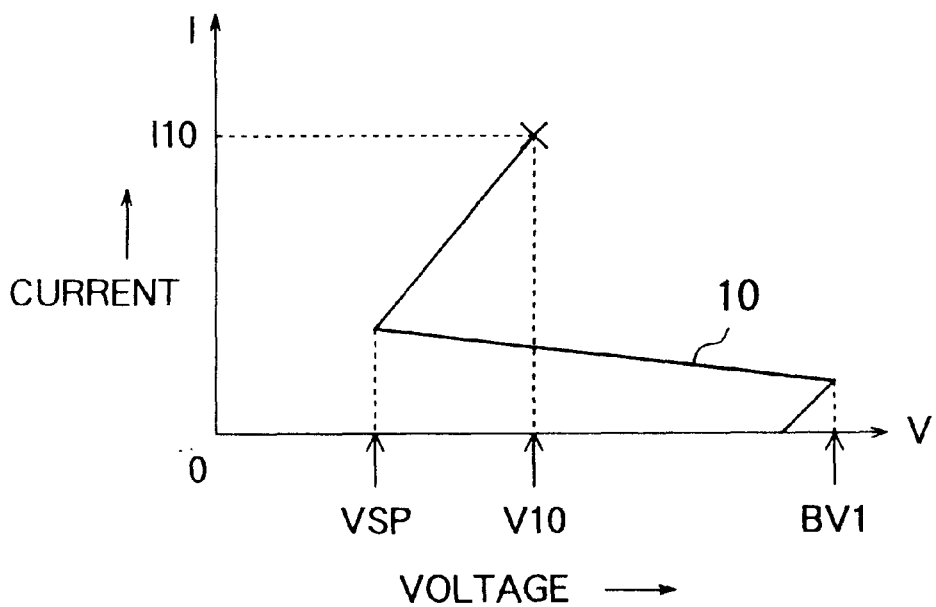
FIG. 4 is a diagram showing a snapback characteristic of the electrostatic protection circuit according to the first conventional example.

Herein, a snapback characteristic of the electrostatic protection circuit illustrated in FIG. 1 is represented by FIG. 4.

In FIG. 4, a waveform 10 shows a relationship between a voltage and a current which appears when the ESD pulse is applied. In FIG. 4, a voltage BV1 represents the breakdown voltage. Further, a voltage VSP denotes the snapback voltage while a voltage V10 represents a breakage voltage of the transistor. Moreover, a current I10 denotes a breakage current value.

In the electrostatic protection circuit illustrated in FIG. 1, the ground terminal GND is grounded while the power supply terminal VDD is put into an open state before a power source is introduced. In consequence, the circuit is put into an OFF state.

In this condition, when the ESD pulse is applied to the electrode pad PAD1, the electric charge caused by the EDS pulse is discharged into the ground terminal GND via the N-channel protection transistor NHT1.

Herein, it is to be noted that the electric charge is discharged by the use of a PN junction forward bias through a PN junction between an N-type drain electrode and a P-type substrate of the N-channel protection transistor NHT1 when the ESD pulse of a negative level is applied to the electrode pad PAD1 with the PN junction forwardly biased. On the other hand, when the ESD pulse of a positive level is applied to the electrode pad PAD1, a P-type substrate and an N-type drain electrode become a backward bias. Consequently, the electric charge is discharged in the state of the snapback voltage VSP after the breakdown.

Second Conventional Example

Subsequently, description will be made about an electrostatic protection circuit according to a second conventional example with reference to FIG. 2.

Herein, it is to be noted that the electrostatic protection circuit according to the second example has been disclosed in Japanese Unexamined Patent Publication No. Sho. 62-105462 (namely, 105462/1987).

The electrostatic protection circuit includes a p-channel protection transistor PHT1 and an N-channel protection transistor which are serially connected to each other. In this event, the P-channel protection transistor PHT1 is coupled to a power supply terminal VDD while the N-channel protection transistor NHT1 is coupled to a ground terminal GND.

Further, the circuit includes an electrostatic protection control transistor portion 2 which has a P-channel MOS transistor PHCT1 and an N-channel MOS transistor NHCT1.

More specifically, a source electrode and a gate electrode are commonly connected to the power supply terminal VDD in P-channel MOS transistor PHT1 while a source electrode and a gate electrode are commonly connected to the ground terminal GND in the N-channel MOS transistor NHT1. In this event, the P-channel MOS transistor and the N-channel MOS transistor are serially connected to constitute an input protection circuit.

Further, a connection point between a drain of the P-channel MOS transistor PHT1 and a drain of the N-channel MOS transistor is coupled to an electrode pad PAD1 and a wiring line L. In this event, the protection circuit is connected to an internal circuit (not shown) via the wiring line L1.

Moreover, a drain electrode of the P-channel MOS transistor PHCT1 is connected to a gate electrode of the P-channel MOS transistor PHT1 via a wiring line L3. Further, a gate electrode of the P-channel MOS transistor PHCT1 is connected to the ground terminal GND while a source electrode is connected to the power supply terminal VDD.

Further, a drain electrode of the N-channel MOS transistor NHCT1 is connected to a gate electrode of the N-channel MOS transistor NHT1 via a wiring line L2. Further, a gate electrode of the N-channel MOS transistor NHCT1 is connected to the power supply terminal VDD while a source electrode is connected to the ground terminal GND.

In this input protection circuit, when the negative level voltage is applied to the electrode pad PAD1, the electric charge is discharged through the PN junction bias of the N-channel protection transistor NHT1 which has a PN junction forwardly biased, like the first conventional example. On the other hand, when the positive level voltage is applied to the electrode pad PAD1, the electric charge is discharged through the PN junction forwardly biased and formed between the N-type drain electrode and the P-type substrate of the N-channel protection transistor NHT1.

However, the gate electrode of the N-channel protection transistor NHT1 is put into a floating state before the power source is introduced to the semiconductor integrated circuit because the N-channel MOS transistor NHCT1 in the protection control transistor portion 2 is turned off. In consequence, the breakdown voltage of the N-channel protection transistor NHT1 illustrated in FIG. 2 becomes low as compared to that of protection transistor NHT1 illustrated in FIG. 1.

Figure 2:
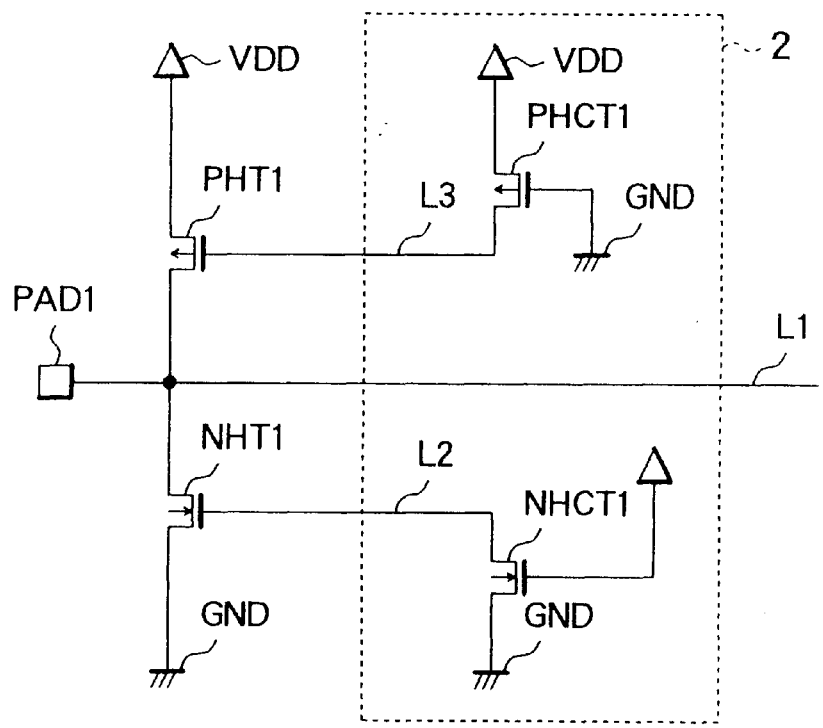
FIG. 2 is a block diagram showing an electrostatic protection circuit according to a second conventional example.

As a result, the protection transistor NHT1 in FIG. 2 can easily transfer to the snapback state as compared to the protection transistor NHT1 in FIG. 1. Consequently, electric charge dispersion capability can be improved and further, the ESD pulse which is applied to the gate electrode can be reduced in the protection transistor NHT1 illustrated in FIG. 2, as compared to the protection transistor NHT1 illustrated in FIG. 1.

Third Conventional Example

Subsequently, description will be made about an electrostatic protection circuit according to a third conventional example with reference to FIG. 3.

Figure 3:
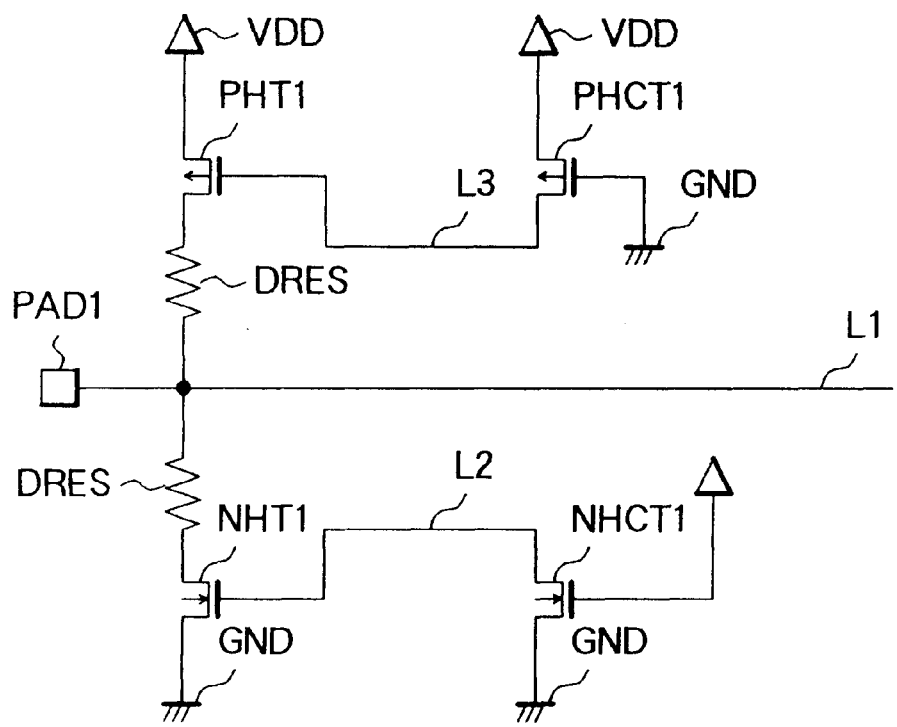
FIG. 3 is a block diagram showing an electrostatic protection circuit according to a third conventional example.

The electrostatic protection circuit according to the third example is similar to the protection circuit according to the second example except that drain electrode resistors DRES are inserted between the P-channel protection transistor PHT1 and the N-channel protection transistor NHT1, as illustrated in FIG. 3.

Figure 5:
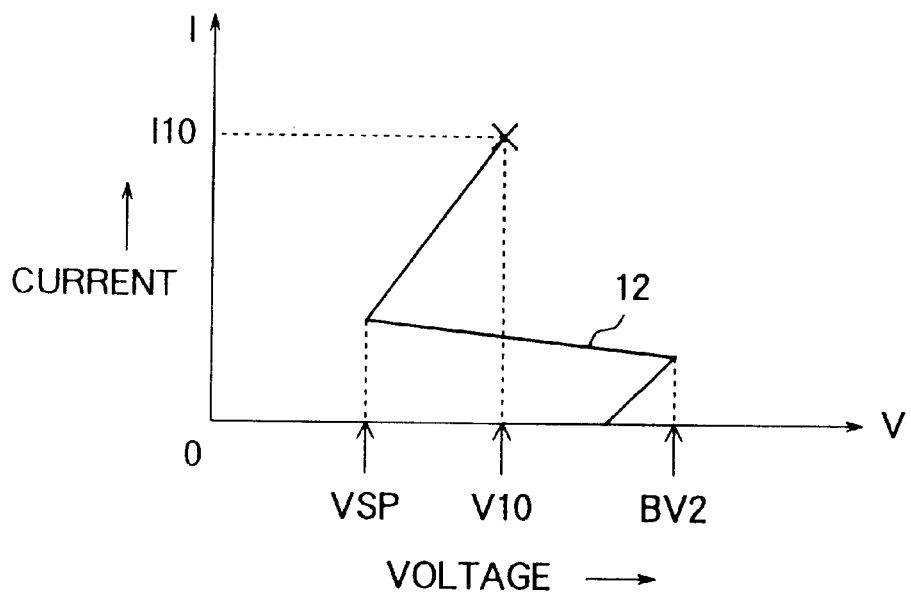
FIG. 5 is a diagram showing a snapback characteristic of the electrostatic protection circuit according to the second conventional example.
Figure 6:
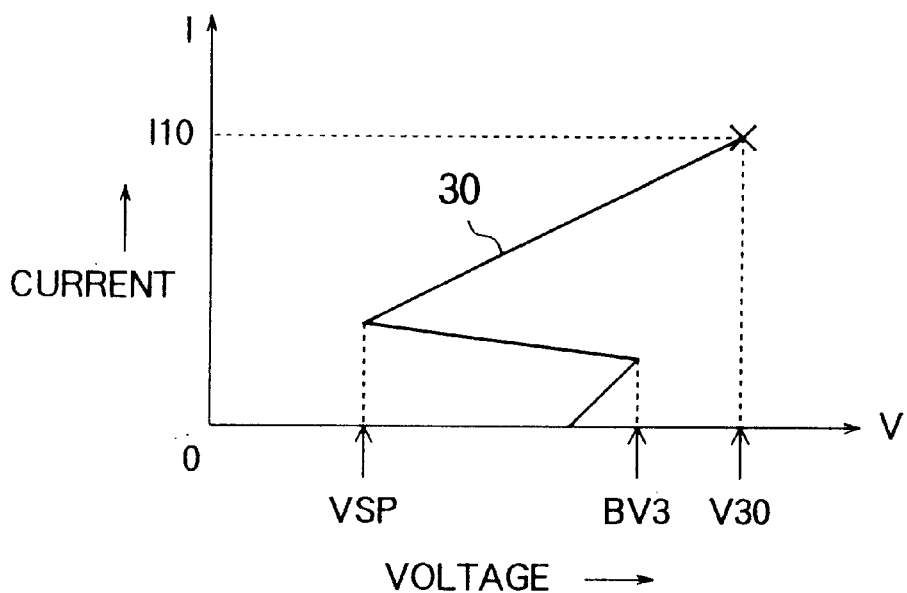
FIG. 6 is a diagram showing a snapback characteristic of the electrostatic protection circuit according to the third conventional example.

Referring to FIGS. 5 and 6, the snapback characteristics of the second example and the third example are shown which appear in response to the ESD pulse, respectively. In this event, the reference numeral 20 denotes a waveform when the ESD pulse is applied while BV2 represents the breakdown voltage in FIG. 5. Further, VSP represents the snapback voltage while V10 denotes the breakage voltage in FIG. 5. Moreover, the reference numeral I10 represents the break current value in FIG. 5.

Likewise, the reference numeral 30 denotes the waveform when the ESD pulse is applied while BV3 represents the breakdown voltage in FIG. 6. Further, VSP represents the snapback voltage while V30 denotes the breakage voltage in FIG. 6. Moreover, the reference numeral I10 represents the breakage current value in FIG. 6.

Herein, although an operation of the third example is similar to the second example, an inclination of a current becomes slow after the snapback state VSP in the third example shown in FIG. 6, as compared to that of the second example in FIG. 5. This is because the drain electrode resistors DRES are inserted, as mentioned before.

Thereby, the breakage voltage V30 of the transistor of the third example in FIG. 6 is increased in comparison with the breakage voltage V10 of the transistor of the second example in FIG. 5. Consequently, after one transistor among a plurality of transistors is put into the snapback voltage VSP, the drain electrode voltage is raised up. As a result, it is easy that the remaining transistors are also put into the snapback voltage VSP.

The above-mentioned conventional examples have a first problem. Namely, even when the electrostatic protection transistor is enlarged in size in the electrostatic protection circuit, the ESD pulse can not be effectively reduced. Therefore, it has been considered that the protection transistor has a large area. In order to enlarge the area of the transistor, a plurality of transistors must be generally connected in parallel.

However, when the area is enlarged by connecting the transistors in parallel in the first conventional example, the respective breakdown voltages are fluctuated between the respective protection transistors. In consequence, the electric charge is concentrated to a specific transistor having a lowest breakdown voltage. As a result, the ESD pulse can not be effectively reduced.

Further, the above-mentioned conventional examples have a second problem. Namely, the breakdown voltages are fluctuated in accordance with a shape and an arranging position of the transistor for raising up the gate electrode of the protection transistor in the electrostatic protection circuit.

More specifically, the gate of the N-channel protection transistor NHT1 is connected to the ground terminal GND via the N-channel protection control transistor NHCT1 in the second example. Likewise, the gate of P-channel protection transistor PHT1 is connected to the power supply terminal VDD via the P-channel protection transistor PHCT1.

In consequence, the gate electrode of the N-channel protection transistor NHT1 is put into the floating state when the power source is in an OFF state. As a result, the N-channel protection transistor NHT1 has a low breakdown voltage so as to easily transfer into the snapback state.

However, the N-channel protection transistor NHT1 has different wiring resistances and contact resistances in accordance with the shape and the arranging position of the N-channel protection control transistor NHCT1 for raising up the gate electrode of the N-channel protection transistor NHT1. Consequently, the breakdown voltage is fluctuated in the N-channel protection transistor NHT1.

Moreover, the above-mentioned conventional examples have a third problem. Namely, a current capability per a unit area of the transistor is reduced when the resistor is inserted for the electrostatic protection in the electrostatic protection circuit.

More specifically, the drain electrode resistors DRES are inserted between the N-channel protection transistor NHT1 and the P-channel protection transistor PHT1 in the third example, as illustrated in FIG. 3. Thereby, the current slope after the snapback state and the breakage voltage V30 is lowered to easily transfer into the snapback state.

For instance, it is assumed that a highly-doped N-type diffusion layer has a diffusion layer resistance value of $7/\Omega$ square length of 0.8 $\mu$m, a width of 70 $\mu$m and a resistance value of 0.08 $\Omega$. In this condition, the highly-doped N-type diffusion layer must have the width of 8 $\mu$m in order to obtain the resistance value of 0.8 $\Omega$. Consequently, the area of the electrostatic protection circuit is inevitably increased. In this event, if the resistor is attached to the drain electrode portion, the drive capability per the unit area of the transistor is reduced.

Taking the above-mentioned problems into consideration, this invention provides an electrostatic protection circuit which is capable of preventing fluctuation of breakdown voltages between of protection transistors and putting a gate electrode of a protection transistor into a stable floating state.

Subsequently, description will be made about an electrostatic protection circuit according to an embodiment of this invention with reference with FIG. 7.

Figure 7:
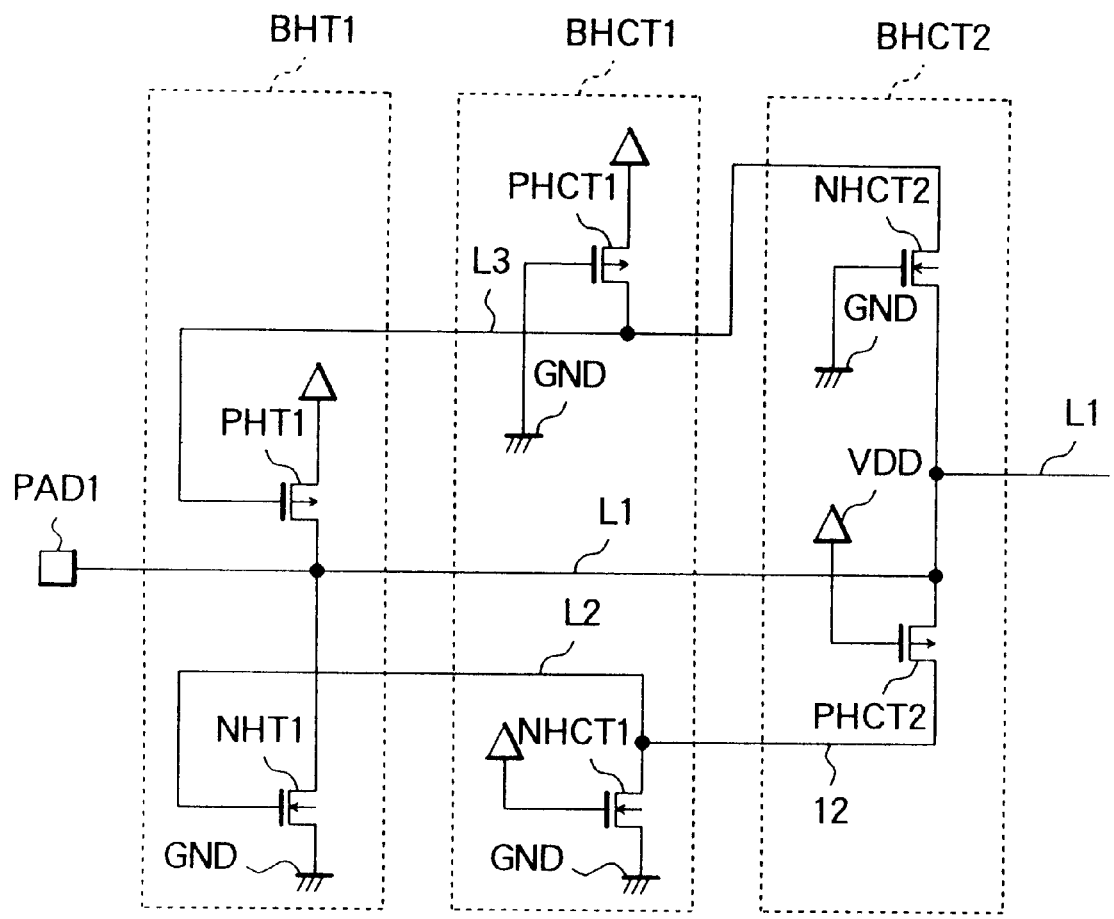
FIG. 7 is a block diagram showing an electrostatic protection circuit according to an embodiment according to this invention.

The illustrated electrostatic protection circuit according to the embodiment mainly has a protection transistor portion BHT1, a protection control transistor portion BHCT1 and a protection control transistor portion BHCT2, as illustrated in FIG. 7. In this event, an electrode pad PAD1 is connected to an internal circuit (not shown) via a wiring line L1.

The protection transistor portion BHT1 is composed of a P-channel protection transistor PHT1 and an N-channel protection transistor NHT1. Herein, a source electrode of the P-channel protection transistor PHT1 is coupled to a power supply terminal VDD. Further, a gate electrode of the P-channel protection transistor PHT1 is commonly connected to a drain electrode of a P-channel protection transistor PHCT1 in the protection control transistor portion BHCT1 and a drain electrode of an N-channel protection transistor NHCT2 in the protection control transistor portion BHCT2 via a wiring line L3.

On the other hand, a source electrode of the N-channel protection transistor NHT1 is coupled to a ground terminal GND. Further, a gate electrode of the N-channel protection transistor NHT1 is commonly connected to a drain electrode of a N-channel protection transistor NHCT1 in the protection control transistor portion BHCT1 and a drain electrode of a P-channel protection transistor PHCT2 in the protection control transistor portion BHCT2 via a wiring line L2.

The protection control transistor portion BHCT1 is composed of the P-channel protection control transistor PHCT1 and the N-channel protection control transistor NHCT1. In this event, a source electrode of the P-channel protection control transistor PHCT1 is coupled to the power supply terminal VDD while a gate electrode of the P-channel protection control transistor PHCT1 is coupled to the ground terminal GND.

On the other hand, a source electrode of the N-channel protection control transistor NHCT1 is coupled to the ground terminal GND while a gate electrode of the N-channel protection control transistor NHCT1 is coupled to the power supply terminal VDD.

The protection control transistor portion BHCT2 is composed of the P-channel protection control transistor PHCT2 and the N-channel protection control transistor NHCT2. As shown in FIG. 7, a gate electrode of the P-channel protection control transistor PHCT2 is coupled to the power supply terminal VDD while a gate electrode of the N-channel protection control transistor NHCT2 is coupled to the ground terminal GND.

Subsequently, an operation will be explained about the above embodiment with reference to FIG. 7.

When a power source is given to the illustrated circuit, the N-channel protection control transistor NHCT1 is turned on because the gate electrode is connected to the power supply terminal VDD. On the other hand, the P-channel protection control transistor PHCT2 is turned off because the gate electrode is connected to the power supply terminal VDD. Consequently, the N-channel protection transistor NHT1 is put into an OFF state.

Further, the P-channel protection control transistor PHCT1 is turned on because the gate electrode is connected to the ground terminal GND. Moreover, the N-channel protection control transistor NHCT2 is turned off because the gate electrode is connected to the ground terminal GND. Consequently, the P-channel protection transistor PHT1 is put into an OFF state.

When the power source is put into the OFF state and the power supply terminal VDD is opened, the gate electrodes of the N-channel protection transistor NHT1 and the P-channel protection transistor PHT1 are variable in potential and are put into the floating states. In this condition, when the ESD pulse is applied to the electrode pad PAD1, the ESD pulse is transferred to the drain electrode of the N-channel protection transistor NHT1 and the source electrode of the P-channel protection control transistor PHCT2 via the wiring line L1.

Under the circumstances, when the ESD pulse of a negative level is applied to the electrode pad PAD1, a PN junction becomes a forward bias in a PN junction between an N-type drain electrode and a P-type substrate of the N-channel protection transistor NHT1. Consequently, the electric charge which is supplied by the ESD pulse is discharged from the drain electrode into the source electrode side in the N-channel protection transistor NHT1.

On the other hand, when the ESD pulse of a positive level is applied to the electrode pad PAD1, a punch-through phenomenon takes place because the P-type substrate and the N-type drain electrode are reversely biased. Consequently, the electric charge is discharged from the drain electrode into the source electrode side in the N-channel protection transistor NHT1.

In this case, as the potential of the electrode pad PAD1 is raised up, the potential of the gate electrode of the N-channel protection transistor NHT1 is stably raised up in accordance with source and drain capacitance of the P-channel protection control transistor PHCT2 which is inserted between the electrode pad PAD1 and the gate electrode of the N-channel protection transistor NHT1. In consequence, the breakdown voltage of the N-channel protection transistor NHT1 becomes low without the fluctuation.

Further, the N-channel protection transistor NHT1 is easily put into the snapback state because the gate electrode of the N-channel protection transistor NHT1 is put into the floating state.

Figure 8:
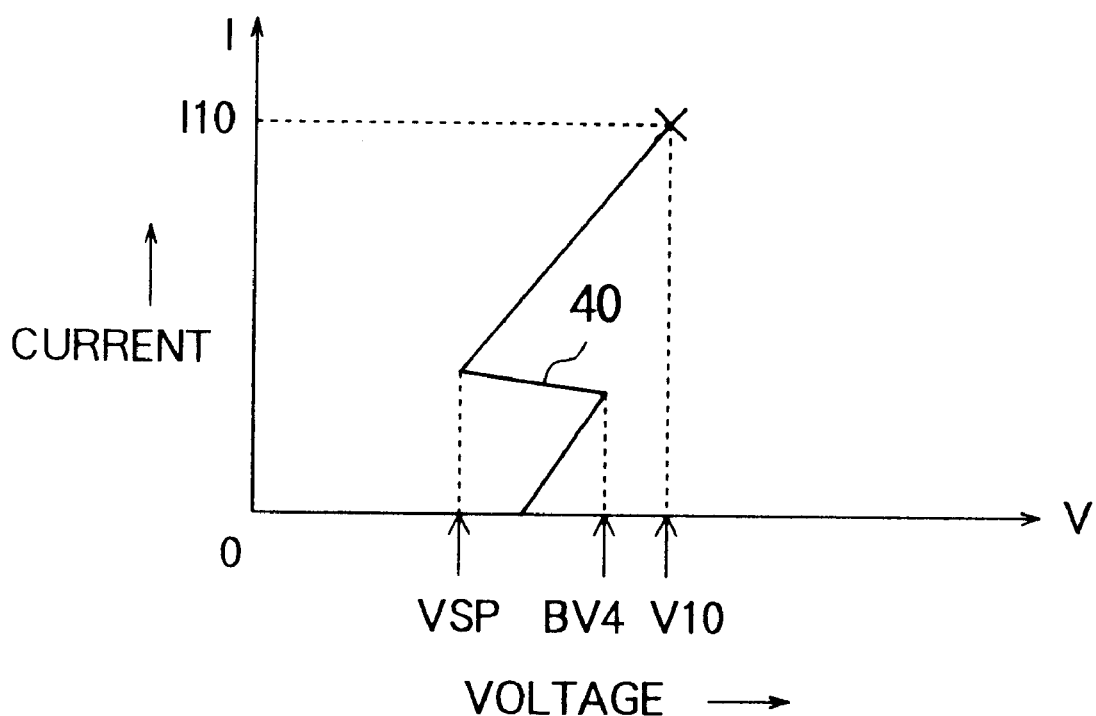
FIG. 8 is a diagram showing a snapback characteristic of an electrostatic protection circuit according to an embodiment of this invention.

In the meanwhile, a snapback characteristic of the protection transistor appearing when the ESD pulse is applied is represented by FIG. 8.

Herein, it is assumed that each of the N-channel protection transistor NHT1 and the P-channel protection transistor PHT1 is structured by a plurality of transistors in FIG. 7, the breakdown voltage BV1 is higher than the breakage voltage V10 in FIG. 4 and the breakdown voltage BV2 is higher than the break voltage V10 in FIG. 5. In this event, when one transistor among a plurality of transistors is turned on, the electric charge is concentrated to the one transistor and as a result, the one transistor is destroyed.

However, if the breakdown voltage BV4 is lower than the break voltage V10 as illustrated in FIG. 8, the remaining transistors are easily turned on. Consequently, the electric charge is also dispersed into the remaining transistors. As a result, the ESD pulse is totally reduced in the electrostatic protection circuit illustrated in FIG. 7.

For instance, the potential of the gate electrode of the N-channel protection transistor NHT1 is raised up from the floating state into the potential at which the punch-through takes place in the N-channel protection transistor NHT1 when the ESD pulse is applied in this embodiment. Thereby, the break down voltage is lowered and further, charge disperse capability is largely improved. In consequence, the drive capability is enhanced.

Further, the P-channel protection control transistor PHCT2 is arranged to raise up the potential of the gate electrode of the N-channel protection transistor NHT1 illustrated in FIG. 7 in this embodiment. In this event, the transistor PHCT2 is equipped by modifying a part of the conventional P-channel protection transistor. Consequently, an area of an output interface portion is not increased, as compared to the third conventional example.

Subsequently, description will be made about a positioning relationship between the protection control transistor portion BHCT2 and the N-channel protection transistor NHT1 with respect to an arrangement of an art work with reference to FIG. 9.

Figure 9:
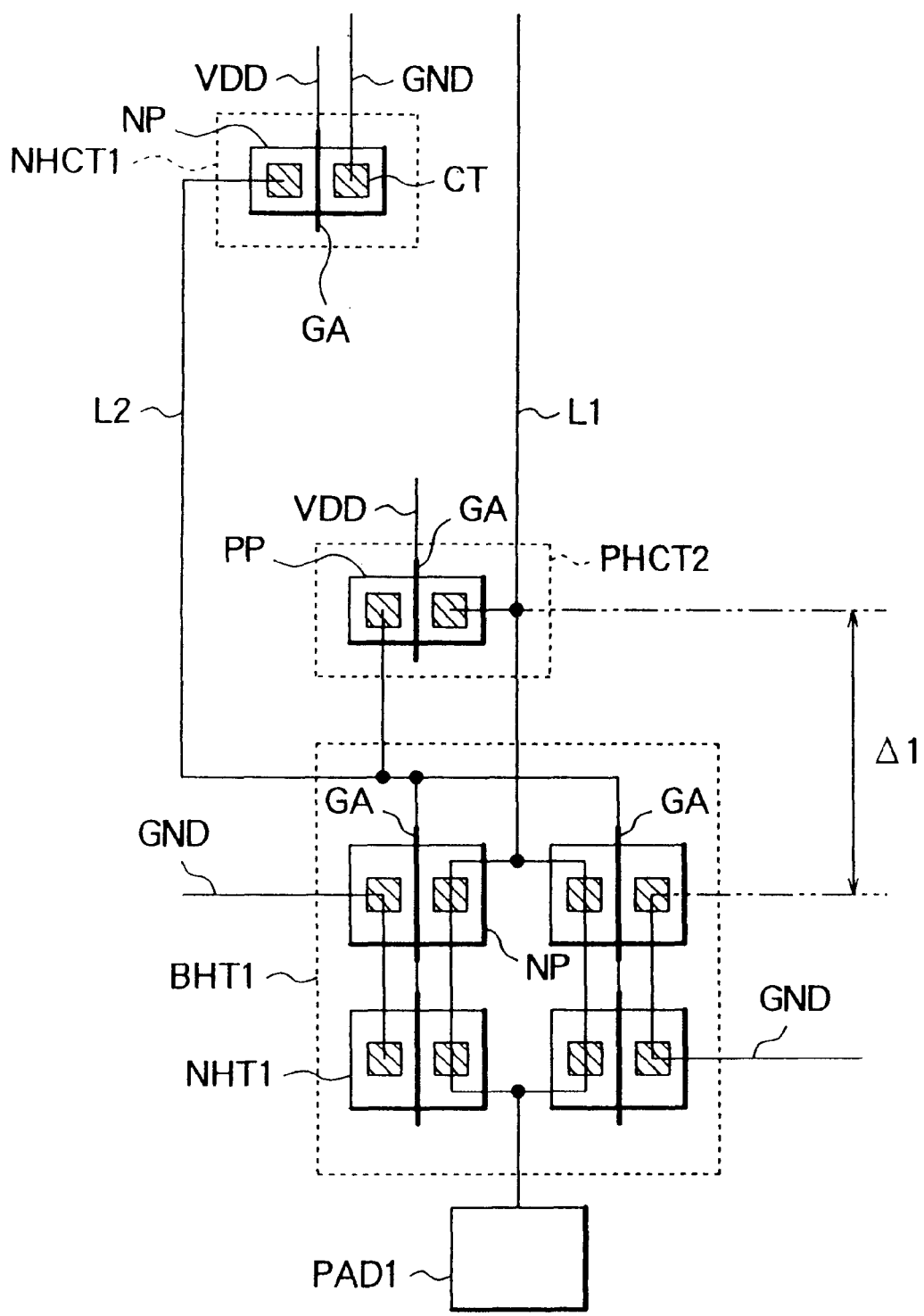
FIG. 9 is a first layout diagram showing an electrostatic protection circuit according to an embodiment of this invention.

In FIG. 9, the N-channel protection transistor NHT1, the N-channel protection control transistor NHCT1 and the P-channel protection control transistor PHCT2 are realized on the art work. Herein, the N-channel protection transistor NHT1 discharges the electric charge which is supplied by the ESD pulse when the ESD pulse is applied in the electrostatic protection circuit in FIG. 7. Further, the N-channel protection control transistor NHCT1 controls the potential of the gate electrode of the N-channel protection transistor NHT1.

Specifically, each of the N-channel protection transistor NHT1, the N-channel protection control transistor NHCT1 and NHCT2 is structured by a source electrode and a drain electrode which are formed by a highly-doped N-type diffusion layer NP and a gate electrode GA which is arranged therebetween.

On the other hand, each of the P-channel protection transistor PHT1, the P-channel protection control transistor PHCT1 and PHCT2 is structured by a source electrode and a drain electrode which are formed by a highly-doped P-type diffusion layer PP and a gate electrode GA which is arranged therebetween.

Further, the PHCT2 transistor in the protection transistor portion BHCT2 is arranged close to the protection transistor portion BHT1 in FIG. 9. In this event, it is desirable that an amplification factor ($\beta$) of the N-channel protection control transistor NHCT1 is optimized with the amplification factor ($\beta$) of the P-channel protection control transistor PHCT1 to inactivate the N-channel protection control transistor NHCT1 and is smaller than that of the P-channel protection transistor PHCT2.

In consequence, the gate electrode of the N-channel protection transistor NHT1 is put into the floating state to uniformly reduce the breakdown voltage. Thereby, the N-channel protection transistor easily and quickly transfers into the snapback state. Further, the electric charge which is introduced by the ESD pulse is quickly discharged and the voltage value of the ESD pulse which is applied to the gate electrode of the N-channel protection transistor NHT1 can be largely reduced.

It is assumed that a distance between the protection transistor portion BHT1 and the P-channel protection control transistor PHCT2 is set to Δ1 in FIG. 9. In this case, the distance between the protection transistor portion BHT1 and the N-channel protection control transistor NHCT1 is set to 3 times of the distance Δ1. Further, the amplification factor (β) of the N-channel protection control transistor NHCT1 is smaller than that of the P-channel protection control transistor PHCT2. Consequently, the inflow of the electric charge into the N-channel protection control transistor is effectively prevented.

For example, the protection control transistor portion BHCT2 has the amplification factor (β) of 375 while the N-channel protection control transistor portion NHCT1 has the amplification factor (β) of 28. Thus, the amplification factor (β) of the N-channel protection control transistor portion NHCT1 is lowered to about 1/13or less than that of the protection control transistor BHCT2. Consequently, the gate electrode of the N-channel protection transistor NHT1 is easily transferred into the floating state.

Moreover, the protection control transistor portion BHCT2 is arranged close to the protection transistor portion BHT1 in FIG. 9. Thereby, the electric charge from the drain electrode of the P-channel protection control transistor PHCT2 does not flow into the N-channel protection control transistor NHCT1. Consequently, the potential of the gate electrode of the N-channel protection transistor NHT1 is raised up. As a result, the potential of the gate electrode of the N-channel protection transistor NHT1 is easily transferred into the floating state.

In consequence, the breakdown voltage is lowered at the voltage difference between the breakdown voltage BV1 in the first conventional example of FIG. 4 and the breakdown voltage BV4 in FIG. 8. Thereby, the electrostatic protection circuit easily transfers into the snapback state in this embodiment.

Likewise, the breakdown voltage is lowered at the voltage difference between the breakdown voltage BV2 in the second conventional example of FIG. 5 and the breakdown voltage BV4 in FIG. 8. Thereby, the electrostatic protection circuit easily transfers into the snapback state in this embodiment.

In this case, the electrostatic protection circuit according to this embodiment was evaluated on the condition that the GND was grounded and the positive pulse is applied in the MIL standard human body model. In the result of the evaluation, the input protection circuit of the first conventional example in FIG. 2 had the breakage limit voltage of 1500 V. In contrast, the protection circuit illustrated in FIG. 7 according to this invention had the breakage limit voltage of 2500 V on the condition that the electrostatic protection transistor had the same area. Thus, the breakage limit voltage in this invention was increased at 1.5 times or high as compared to the first conventional example.

Subsequently, description will be made about a positioning relationship between the protection control transistor portion BHCT2 and the N-channel protection transistor NHT1 with respect to an arrangement of an art work with reference to FIG. 10.

Figure 10:
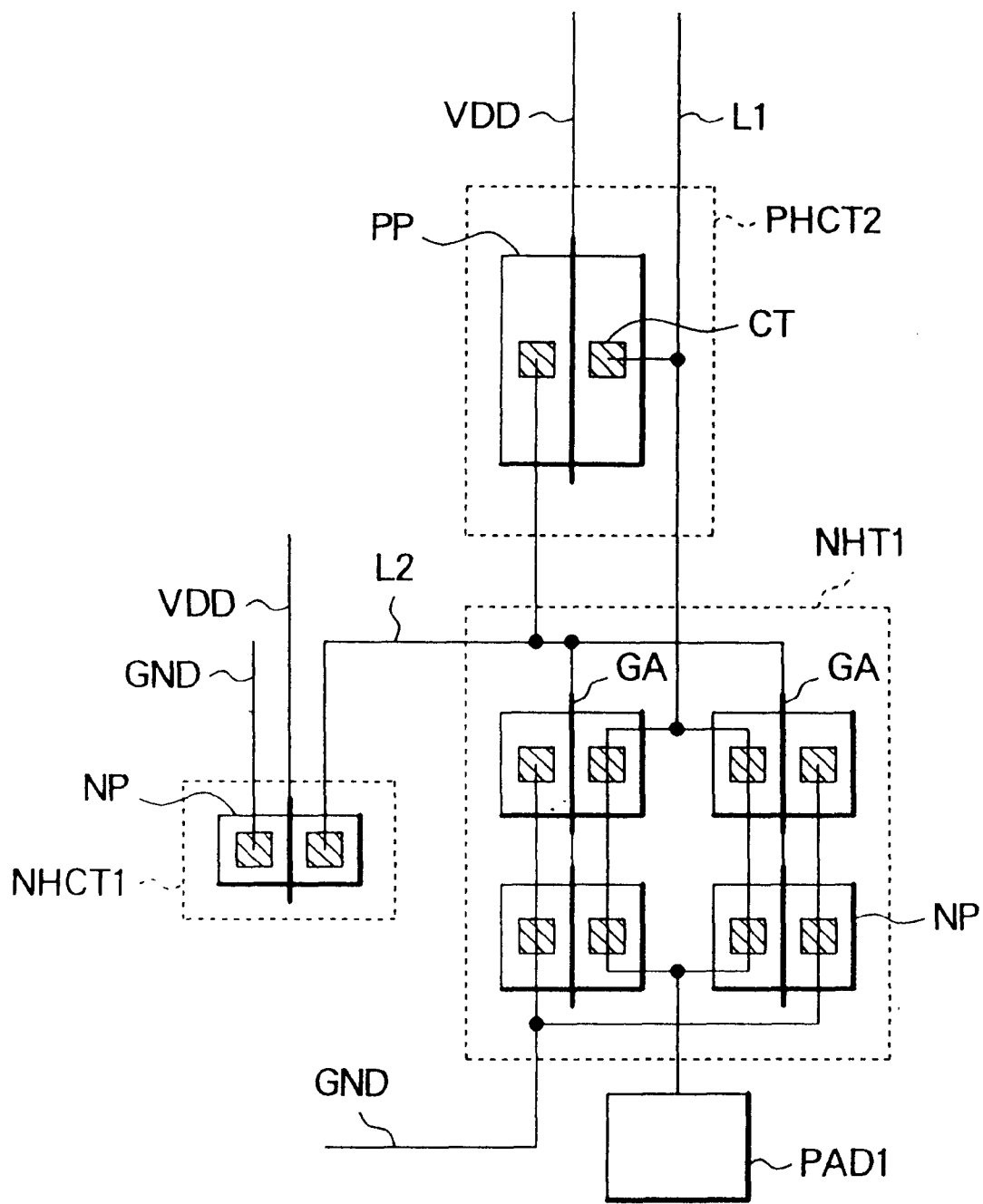
FIG. 10 is a second layout diagram showing an electrostatic protection circuit according to an embodiment of this invention.

In FIG. 10, the N-channel protection transistor NHT1, the N-channel protection controls transistor NHCT1 and the P-channel protection control transistor PHCT2 are realized on the artwork. Herein, the N-channel protection transistor NHT1 discharges the electric charge which is supplied by the ESD pulse when the ESD pulse is applied in the electrostatic protection circuit in FIG. 7. Further, the N-channel protection control transistor NHCT1 controls the potential of the gate electrode of the N-channel protection transistor NHT1.

In FIG. 10, the amplification factor (β) is increased by increasing a gate width (W) of the P-channel protection control transistor PHCT2. Consequently, when the amplification factor (β) of the N-channel protection transistor NHCT1 is high, or when the N-channel protection transistor NHCT1 is close to the N-channel protection transistor NHT1, or in the both cases, the inflow of the electric charge to the N-channel protection control transistor NHCT1 is prevented to raise up the potential of the gate electrode of the N-channel protection transistor NHT1.

Thereby, the gate electrode of the N-channel MOS protection transistor is easily put into the floating state. Consequently, the breakdown voltage becomes low to easily put into the snapback state. As a result, the ESD pulse is effectively reduced.

Subsequently, description will be made about a positioning relationship between the protection control transistor portion BHCT2 and the N-channel protection transistor NHT1 with respect to an arrangement of an art work with reference to FIG. 11.

Figure 11:
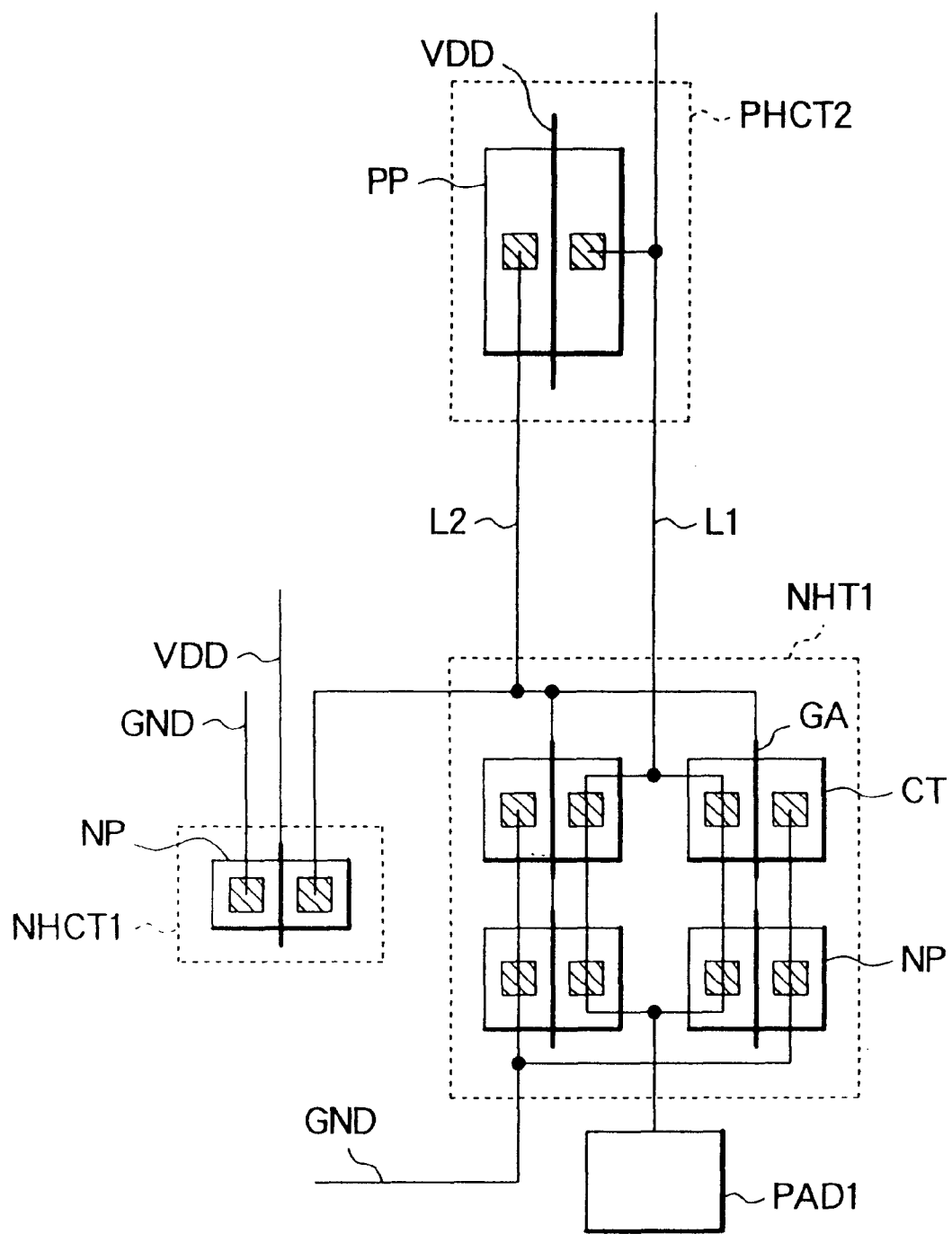
FIG. 11 is a third layout diagram showing an electrostatic protection circuit according to an embodiment of this invention.

In FIG. 11, the N-channel protection transistor NHT1, the N-channel protection control transistor NHCT1 and the P-channel protection control transistor PHCT2 are realized on the art work. Herein, the N-channel protection transistor NHT1 discharges the electric charge which is supplied by the ESD pulse when the ESD pulse is applied in the electrostatic protection circuit in FIG. 7. Further, the N-channel protection control transistor NHCT1 and P-channel protection control transistor PHCT2 control the potential of the gate electrode of the N-channel protection transistor NHT1.

In FIG. 11, the PHCT2 transistor in the protection control transistor portion BHCT2 is arranged far from the NHT1 transistor in the protection transistor portion BHT1 to increase the gate width (W) and the amplification factor (β). When the PHCT2 transistor in the protection control transistor portion BHCT2 is arranged far from the NHT1 transistor in the protection transistor portion BHT1, a wiring resistance therebetween becomes large. However, the drain and source capacitance of the P-channel protection control transistor PHCT2 is also increased by increasing the amplification factor (β).

Thereby, the gate electrode of the N-channel MOS protection transistor NHT1 is raise up to easily put into the floating state. Consequently, the breakdown voltage becomes low to easily put into the snapback state. As a result, the ESD pulse is effectively reduced.

Herein, it is assumed that the GND terminal may replace the VDD terminal, and the N-channel transistor may be substituted for the P-channel transistor. Namely, the P-channel protection transistor may be replaced by the N-channel protection transistor NHT1, the P-channel protection control transistor PHCT1 may be replaced by the N-channel protection control transistor NHCT1 and the N-channel protection control transistor NHCT2 may be substituted for the P-channel protection control transistor PHCT2. It is not to say that the above-mentioned same effect can be obtained in this case.

What is claimed is:

1. An electrostatic protection circuit which protects an internal circuit from electric charge which is applied via an electrode pad and which is coupled to a power source, comprising:

a protection transistor portion which includes at least one first transistor having a first gate electrode in order to protect said internal circuit by discharging the electric charge via said first transistor;

a first protection control transistor portion which includes at least one second transistor which controls so as to keep the first gate electrode into a floating state before the power source is introduced; and a second protection control transistor portion which includes at least one third transistor which gives a predetermined potential to the first gate electrode wherein said protection transistor portion includes a plurality of said first transistors each of which has a breakdown voltage, and said third transistor is arranged closer to said first transistor than said second transistor so as to uniformly reduce the breakdown voltages, and wherein an amplification factor of said second transistor is optimized with an amplification factor of another second transistor in said first protection control transistor portion, and wherein said amplification factor of said second transistor is smaller than that of said third transistor.

2. An electrostatic protection circuit which protects an internal circuit from electric charge which is applied via an electrode pad and which is coupled to a power source, comprising:

a protection transistor portion which includes at least one first transistor having a first gate electrode in order to protect said internal circuit by discharging the electric charge via said first transistor;

a second transistor which controls so as to keep the first gate electrode into a floating state before the power source is introduced; and a third transistor which gives a predetermined potential to the first gate electrode wherein said first transistor further includes first source and drain electrodes, said second transistor includes second source, drain and gate electrodes, said third transistor includes third source, drain and gate electrodes, said first gate electrode being connected to said second drain electrode and said second drain electrode being connected to said third drain electrode, said third transistor is arranged close to said first transistor to improve an amplification factor of said third transistor on the condition that a gate width of said third gate electrode is made wider.

3. An electrostatic protection circuit which protects an internal circuit from electric charge which is applied via an electrode pad and which is coupled to a power source, comprising:

a protection transistor portion which includes at least one first transistor having a first gate electrode in order to protect said internal circuit by discharging the electric charge via said first transistor;

a second transistor which controls so as to keep the first gate electrode into a floating state before the power source is introduced; and a third transistor which gives a predetermined potential to the first gate electrode wherein said first transistor further includes first source and drain electrodes, said second transistor includes second source, drain and gate electrodes, said third transistor includes third source, drain and gate electrodes, said first gate electrode being connected to said second drain electrode and said second drain electrode being connected to said third drain electrode, said third transistor is arranged farther from said first transistor than said second transistor.

* * * * *